(12) United States Patent
Rehm

(10) Patent No.: US 11,504,786 B2
(45) Date of Patent: Nov. 22, 2022

(54) REFLOW SOLDERING SYSTEM FOR COMBINED CONVECTION SOLDERING AND CONDENSATION SOLDERING

(71) Applicant: Rehm Thermal Systems GmbH, Blaubeuren-Seissen (DE)

(72) Inventor: Johannes Rehm, Blaubeuren-Seissen (DE)

(73) Assignee: REHM THERMAL SYSTEMS GMBH, Blaubeuren-Seissen (DE)

( * ) Notice: Subject to any disclaimer, the term of this patent is extended or adjusted under 35 U.S.C. 154(b) by 91 days.

(21) Appl. No.: 17/005,590

(22) Filed: Aug. 28, 2020

(65) Prior Publication Data
US 2021/0069810 A1    Mar. 11, 2021

(30) Foreign Application Priority Data
Sep. 5, 2019    (DE) .......................... 102019213511.0

(51) Int. Cl.
| B23K 3/00 | (2006.01) |
| B23K 1/008 | (2006.01) |
| B23K 3/04 | (2006.01) |
| B23K 101/42 | (2006.01) |
| H05K 13/04 | (2006.01) |

(52) U.S. Cl.
CPC ................ B23K 1/008 (2013.01); B23K 3/04 (2013.01); *B23K 2101/42* (2018.08); *H05K 13/0465* (2013.01)

(58) Field of Classification Search
CPC .. B23K 1/008; B23K 2101/42; B23K 1/0016; B23K 1/012; B23K 1/015; B23K 37/0211; B23K 37/0282; B23K 37/047; B23K 3/04; B23K 3/08; B23K 3/087; B23K 2101/36; H05K 13/0465; H05K 3/34
USPC ...................... 228/234.2, 179.1–180.22, 8–9
See application file for complete search history.

(56) References Cited

U.S. PATENT DOCUMENTS

| 4,240,453 A | * | 12/1980 | Vial | H05K 3/26 |
| | | | | 134/107 |
| 4,321,031 A | * | 3/1982 | Woodgate | B23K 1/015 |
| | | | | 219/388 |
| 4,628,616 A | * | 12/1986 | Shirai | H05K 13/0465 |
| | | | | 34/78 |
| 4,698,915 A | * | 10/1987 | Dickinson | B23K 1/015 |
| | | | | 134/11 |

(Continued)

FOREIGN PATENT DOCUMENTS

| CN | 1409589 | 4/2003 |
| CN | 1668409 | 9/2005 |

(Continued)

OTHER PUBLICATIONS

German Office Action in corresponding German application No. 10 2019 213 511.0; 5 pages.

(Continued)

*Primary Examiner* — Kiley S Stoner
(74) *Attorney, Agent, or Firm* — Fattibene and Fattibene, LLC; Paul A. Fattibene

(57) ABSTRACT

A reflow soldering system comprising one or a plurality of individually heatable soldering process zones. The reflow soldering system is configured to supply heat to a workpiece selectively through condensation or through convection or as a combination of convection and condensation.

12 Claims, 1 Drawing Sheet

(56) References Cited

U.S. PATENT DOCUMENTS

| | | | | |
|---|---|---|---|---|
| 4,735,001 A * | 4/1988 | Mishina | ............... | B23K 1/015 118/61 |
| 4,771,929 A * | 9/1988 | Bahr | ............... | H05K 3/3494 228/102 |
| 4,804,128 A * | 2/1989 | Brittin | ............... | B23K 1/008 228/217 |
| 4,886,449 A * | 12/1989 | Brittin | ............... | B23K 1/008 432/121 |
| 5,146,694 A * | 9/1992 | Mishina | ............... | B23K 1/015 118/61 |
| 5,436,202 A * | 7/1995 | Miura | ............... | H01L 21/50 228/102 |
| 6,005,224 A | 12/1999 | Wesseling et al. | ............... | 219/388 |
| 6,015,966 A | 1/2000 | Rehm | ............... | 219/388 |
| 6,386,422 B1 * | 5/2002 | Cheng | ............... | B23K 1/008 228/46 |
| 7,380,699 B2 | 6/2008 | Dokkedahl | ............... | 228/234.2 |
| 2001/0030386 A1 | 10/2001 | Garidel | ............... | 264/347 |
| 2002/0007565 A1 * | 1/2002 | Bell | ............... | B23K 1/015 34/60 |
| 2003/0057546 A1 | 3/2003 | Memory et al. | ............... | 257/706 |
| 2003/0196551 A1 * | 10/2003 | Dautenhahn | ............... | B23K 3/08 95/273 |
| 2003/0213833 A1 * | 11/2003 | Nakamura | ............... | B23K 31/02 228/256 |
| 2003/0218058 A1 * | 11/2003 | Shaw | ............... | B23K 1/012 228/230 |
| 2004/0238602 A1 * | 12/2004 | Furuno | ............... | H01L 21/67138 228/180.22 |
| 2005/0173497 A1 * | 8/2005 | Dokkedahl | ............... | B23K 1/015 228/219 |
| 2005/0242163 A1 | 11/2005 | Bell et al. | ............... | 228/234.2 |
| 2007/0194083 A1 | 8/2007 | Leicht | ............... | 228/101 |
| 2008/0061116 A1 | 3/2008 | Bell | ............... | 228/194 |
| 2008/0185421 A1 * | 8/2008 | Diehm | ............... | B23K 1/008 228/176 |
| 2009/0236402 A1 * | 9/2009 | Willenegger | ............... | B23K 1/008 228/45 |
| 2010/0264197 A1 * | 10/2010 | Aoyama | ............... | B23K 1/08 228/219 |
| 2011/0248074 A1 | 10/2011 | Davies | ............... | 228/256 |
| 2013/0175323 A1 * | 7/2013 | Zhang | ............... | H01L 21/67173 228/4.1 |
| 2016/0107253 A1 | 4/2016 | Kuhn et al. | ............... | B23K 3/06 |
| 2016/0167148 A1 * | 6/2016 | Oyama | ............... | B23K 1/0016 228/234.2 |
| 2018/0333796 A1 * | 11/2018 | Diepstraten | ............... | B23K 1/0016 |
| 2020/0101549 A1 * | 4/2020 | Hutzler | ............... | H01L 24/83 |
| 2020/0141652 A1 * | 5/2020 | Nagai | ............... | F27D 7/02 |

FOREIGN PATENT DOCUMENTS

| | | | | |
|---|---|---|---|---|
| CN | 1689746 | | 11/2005 | |
| CN | 204922973 | | 12/2015 | |
| CN | 105689831 A | * | 6/2016 | ............. B23K 1/015 |
| DE | 10025472 | | 12/2001 | |
| DE | 69907767 | | 11/2004 | |
| EP | 0023107 A1 | * | 1/1981 | ............. B23K 1/015 |
| EP | 0864391 | | 9/1998 | |
| EP | 0931618 | | 7/1999 | |
| EP | 1036626 A2 | * | 9/2000 | ............. B23K 1/015 |
| EP | 1157771 | | 11/2001 | |
| JP | 62234658 A | * | 10/1987 | ............. B23K 1/015 |
| JP | S62270275 | | 11/1987 | |
| JP | 63030172 A | * | 2/1988 | ............. B23K 1/015 |
| JP | 63154261 A | * | 6/1988 | ............. B23K 1/015 |
| JP | 2016115732 A | * | 6/2016 | ............. B23K 1/015 |
| RU | 2005111017 | | 10/2006 | |
| RU | 2006113693 | | 12/2007 | |
| RU | 2011128571 | | 1/2013 | |
| RU | 201514636 | | 4/2017 | |
| WO | WO 03106093 | | 12/2003 | |
| WO | WO 2005087422 | | 9/2005 | |
| WO | WO-2014203499 A1 | * | 12/2014 | ............. B23K 1/015 |

OTHER PUBLICATIONS

Indian Office Action or Search Report dated Sep. 1, 2021 in counterpart Indian application No. 202044037876; 6 pages.

Dziurdzia et al., "Voiding in Laed-Free Soldering of Components with Large Solder Pads", Dec. 22, 2016; Proceedings ofSPIE, vol. 10175, 1017506, pp. 1-7.

European Office Action or Search Report dated Feb. 9, 2021 in counterpart European application No. 20193025.2; 8 pages.

English translation of Russian Office Action or Search Report dated Dec. 29, 2020 in counterpart Russian application No. 2020126748/05; 6 pages.

Chinese Office Action or Search Report dated Nov. 22, 2021 in counterpart Chinese application No. 202010841484.8; English translation 11 pages.

* cited by examiner

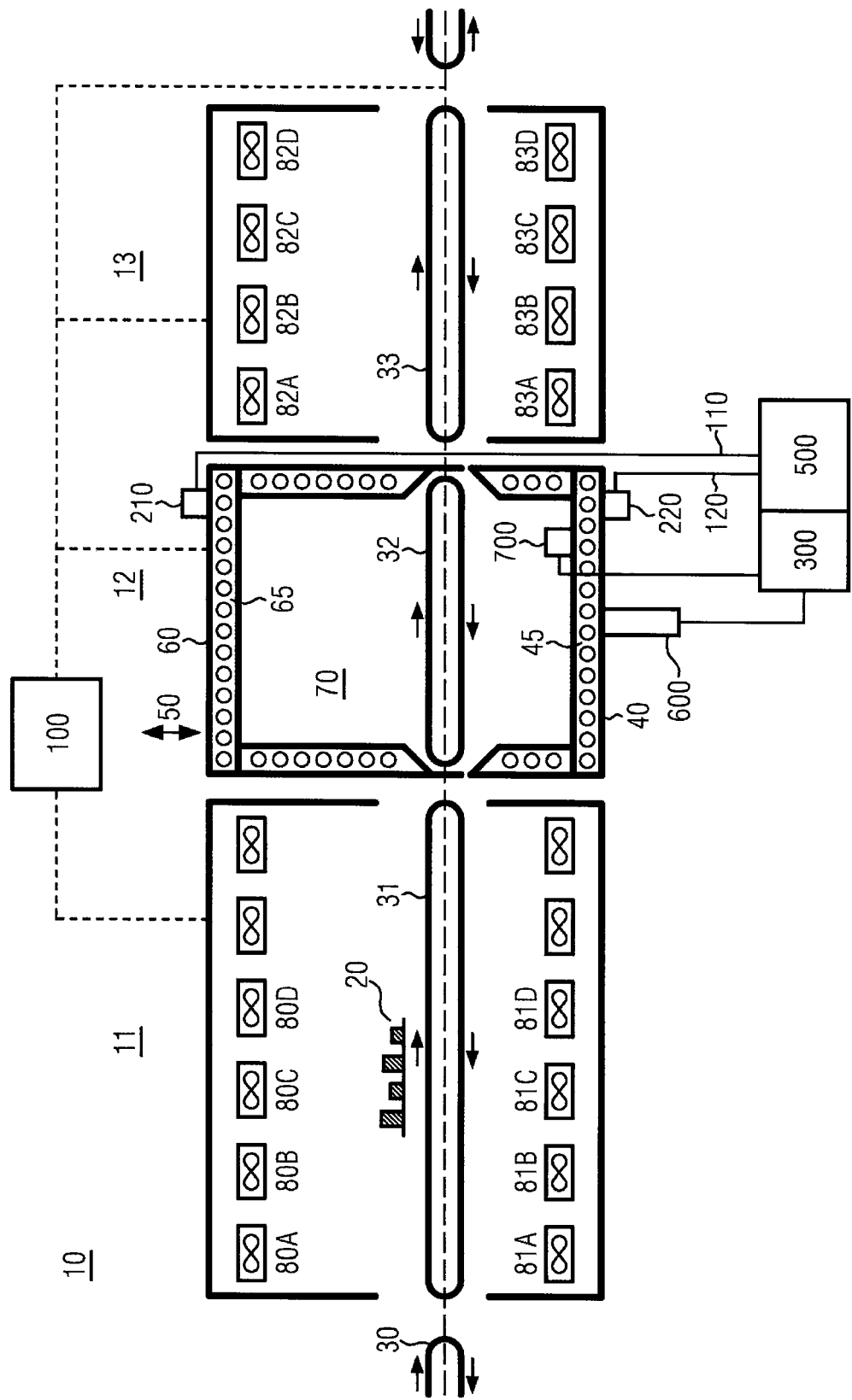

REFLOW SOLDERING SYSTEM FOR COMBINED CONVECTION SOLDERING AND CONDENSATION SOLDERING

FIELD OF THE INVENTION

The present invention relates generally to reflow soldering systems with individual heating zones. In particular, the present invention relates to reflow soldering systems operating according to the convection principle and the condensation principle.

BACKGROUND OF THE INVENTION

The term reflow soldering refers to a soft soldering process for soldering electronic components, which is commonly used in the field of electrical engineering. In the first step of reflow soldering, a soft solder in the form of a soldering paste is applied to a substrate such as a board/circuit board before the latter is populated. In the next step, components are then placed onto the sticky soldering paste. Subsequently, the populated circuit board is heated such that the solder contained in the soldering paste melts.

In order to achieve the best possible results in reflow soldering, a particular temperature-time profile, the so-called "reflow profile", should be determined prior to each process. On the basis of this analysis, the soldering system can be adjusted to the production process as regards process stability and energy consumption. The reflow profile depends on the thermal mass as well as on the material characteristics and the nature of the various components on the circuit board. Without specific reflow profiling, sensitive components may be overheated, damaged or become unstable, and this would lead to a reduction of their function. In addition, the temperature-time profile determines the quality of the solder joints. In order to minimize these deficiencies, it will be advantageous to determine an optimum temperature profile/reflow profile matched to a product to be manufactured.

The heating processes used for this purpose aim at implementing the determined reflow profiling efficiently and accurately. To this end, various heat transfer mechanisms, such as "convection" and "condensation", are used in electronics production for soldering electronic assemblies. Both processes have their advantages and disadvantages, which decide on the use of the respective process.

Convection Soldering

In convection soldering, the soldering process takes place through convection, i.e. by transferring heat via a flow of gases, such as air or nitrogen. Due to its flexibility in profiling, the high productivity and easy handling, convection soldering is the most frequently used process. The heat transfer media used are gases or mixtures of gases, such as nitrogen or air.

The disadvantages of the convection soldering process are to be seen in the fact that, due to the limited heat transfer (heat transfer coefficient 30 to 80 W/m$^2$K), no solder assemblies having large thermal masses can be processed. Because of this disadvantage, reflow soldering often leads to excessive temperature differences between the small and the large thermal masses on the assemblies, which partly manifest themselves as a quality defect at the realized solder joints. Convection soldering may also have the effect that the upper temperature limits resulting from the resistance to soldering heat of e.g. electronic components are exceeded.

Condensation soldering (or vapor-phase soldering) A condensation soldering system according to the prior art is described e.g. in European patent EP 931618 B1. In condensation soldering processes, a fluid (heat transfer medium and condensation agent, respectively), normally perfluoropolyether (PFPE) having a boiling point of e.g. 240° C., is used. Condensation soldering offers several advantages in comparison with convection soldering. For example, vapor-phase soldering provides about 10 times more energy per unit time than a convection reflow soldering process (heat transfer coefficient of up to 300 W/m$^2$K). Condensation soldering offers a more homogeneous heat distribution due to film condensation of the medium in comparison with convection soldering. The condensation agent creates an inert process environment, since PFPE is inert. Overheating can be avoided to a large extent because the maximum achievable temperature can be limited e.g. to 240° C. by the medium used (PFPE for example as sold under the trademark Galden HS240). Furthermore, condensation soldering systems provide a hermetically tight process chamber, thus allowing a vacuum process to be executed. Also with respect to residue management (removal of solder fumes), the systems working according to the condensation principle are superior to convection soldering systems. In the convection soldering system, the volatile components evaporate in the preheating and peak ranges. In a condensation soldering system according to EP 931618 B1 all the residues evaporate in a closed chamber. The residues are evacuated with the vapor (gas/fluid) and cleaned, which means that the process chamber will always remain clean. This leads to significantly shorter maintenance times for condensation systems in comparison with convection soldering systems.

The disadvantages of condensation soldering carried out e.g. according to the principle described in patent EP 931618 B1 (German translation DE 699 07 767) are, in comparison with convection soldering, a lower throughput and less flexibility in reflow profiling. This reduced flexibility results from the necessity to execute the phase change of the medium (gaseous-liquid) in almost closed chambers in order to avoid media losses. Due to the comparatively long soldering time in the peak phase (i.e. the phase with maximum temperature for melting the solder), rapid cooling of the assembly may reduce the quality of the solder joint. If the soldering time in the peak phase is too short, the soldering paste will not be fully melted. If, however, the time is too long, one of the consequences will be that the intermetallic phase becomes too thick.

Problem Description

The increasing use of power electronics in vehicles is leading to an increase in the thermal mass of electronic assemblies. In most cases, the components processed on these assemblies are also very small (following the general trend in electronics). During reflow soldering, this leads to an increase in the temperature differences between the thermal masses (power components and small components).

These factors lead to an increase in the use of condensation soldering at the expense of reflow profiling flexibility and throughput. On the one hand, the increasing quality standards require more flexibility in reflow profiling and, on the other hand, the production plants also want a high throughput (according to the usually high number of pieces of automotive production), which can only be accomplished to a limited extent making use of the condensation principle. In addition, the higher demands on the reliability of solder joints necessitate vacuum processes of the type described e.g. in the International Patent Application WO 2005/087422 A1.

Depending on the process requirements, users must currently choose one or the other process and thus a system type. For financial reasons and reasons of space, two system types (convection and condensation) are purchased only very rarely.

What would be desirable is a system allowing a combination of convection soldering and condensation soldering. However, a combination of convection soldering and condensation soldering has not been taken into consideration up to now, since the convection system is an open system, and this is also its biggest advantage, whereas the condensation system is a closed system, and this is both advantageous (vacuum, contamination) and disadvantageous (low throughput). Since a system can only be either open or closed, a combination of an open and a closed system that combines both advantages is difficult to imagine. The different principles (open/closed) also make a hybrid system more susceptible to cross-contamination.

The following additional difficulties result from the combination of the open system for convection soldering and the closed system for condensation soldering:

The continuous flow principle of conventional convection systems makes it impossible to integrate a completely closed chamber with e.g. one or two doors. Another problem is the thermal stabilization of the closed chamber. If the inner chamber walls are not at a higher temperature above the boiling point of the condensation medium, such as Galden, not enough gas will be generated to control a condensation soldering process. If the closed system is integrated into the open system, the closed system must inevitably be opened in order to allow assemblies to be transferred from one system to the other. This makes the thermal stabilization of the closed system more difficult.

Conventional continuous flow condensation systems always entail the problem of contamination of the process chamber, a problem that originates from the solder fumes separating from the soldered items. These residues contaminate the process chamber of the condensation soldering process, which works as a closed system, and the medium, such as Galden, which is circulated.

It is therefore an object of the present invention to provide a reflow soldering system, which allows complex reflow profiles and high throughputs in a flexible manner, in combination with an improved quality of the solder joints.

SUMMARY OF THE INVENTION

This object is achieved by a reflow soldering system according to the claims. The reflow soldering system according to the present invention comprises one or a plurality of individually heatable soldering process zones. In addition, the reflow soldering system according to the present invention is configured to supply heat to a workpiece "selectively" through condensation or through convection or as a combination of convection and condensation.

In order to meet the above-mentioned requirements and to allow the processing of various assemblies on one system according to both the condensation and the convection principle, the present invention combines both processes in such a way that the new system will be able to work "selectively" with the condensation process, with the convection process or with a combination of convection and condensation. Since the system is able to carry out the various operating modes selectively, the plant is configured such that components which are not needed can be shut down, without the other process sequences being impeded. This means that, if the system operates in an operating mode which only requires convection soldering, the condensation process zone will be in an idle state and the workpieces processed can pass the condensation process zone unhindered. In this way, it is possible to benefit from the advantages of the individual processes as well as to achieve a compromise between advantages and disadvantages when both these processes are combined.

According to an embodiment, the reflow soldering system includes at least two soldering process zones comprising at least one condensation process zone and at least one convection process zone located upstream or downstream of the latter. In this embodiment convection modules can be used for the convection process zone and condensation modules can be used for the condensation process zone. The process modules may here be operated individually, with the individual advantages, or in combination. In a combined operating mode, the convection module can be used for preheating, if the convection process zone is located upstream. The peak range (temperature range for melting the solder (soldering)) can then be realized in the condensation module. If the convection process zone is located downstream, the convection module may e.g. be configured as a cooling zone.

In a further development of this embodiment, the reflow soldering system has at least three soldering process zones, comprising an upstream convection process zone, a condensation process zone and a downstream convection process zone. This increases the flexibility of implementing a "reflow profile" still further. In mixed operation, the downstream convection process zone may be configured as a cooling zone while the upstream convection process zone may be configured as a preheating zone. The peak range may again be implemented in the condensation process zone.

The peak range may also be realized in the upstream convection process zone alone. In this case, the condensation process zone may be switched off, thus increasing the throughput. Such an operating mode would be possible, for example, if the differences in the thermal masses of the components were not too great.

In addition, the separation of the soldering process into three separate sections with different heat transfer mechanisms helps to minimize the contamination problem. In the convection preheating process, many substances are already expelled from the items to be soldered, and these substances can then no longer contaminate the hermetically sealed soldering chamber (peak).

According to a further embodiment, the reflow soldering system includes a conveyor comprising a plurality of segments for conveying the workpiece through the soldering process zones and from one soldering process zone to the next. In addition, the condensation process zone is configured to operate selectively as a hermetically sealed process chamber or to allow the conveyor to pass workpieces unhindered. This realizes a technical implementation of selectively operating the reflow soldering system as condensation soldering systems, a convection soldering system or a combined soldering system. Configuring the condensation process zone as a unit that operates both as a hermetically sealed process chamber (closed system) and as an open system in an inactive state allows the closed system to be "selectively" connected to the open system. Making use of the segmented conveyor system, the soldering process zones can be combined in a flexible manner and an optimum work flow can be accomplished.

According to an embodiment thereof, the reflow soldering system further comprises a control unit that is able to control the segments of the conveyor individually and to control the reflow soldering system such that it selectively allows the following modes of operation:

- mode 1: mere convection soldering system with the condensation process zone switched off,
- mode 2: mere condensation soldering system with the convection process zone switched off, and
- mode 3: combined soldering system with an arbitrary combination of components of the convection process zone and the condensation process zone, so as to implement complex soldering profiles.

The control unit therefore allows pre-configuration of the reflow soldering system, depending on the operating modes, and this simplifies operation.

According to a further embodiment, the hermetically sealed process chamber is configured as a first half-shell and a second half-shell, at least one of the half-shells being movable perpendicularly to a conveying direction of the conveyor, so that the hermetically sealed process chamber will be able to assume an open state, in which a conveyed workpiece can be moved into and out of the condensation process zone. The realization of the hermetically sealed process chamber as half shells allows the closed condensation process zone to be integrated into the open convection process zone with selective activation or deactivation of the condensation process zone while maintaining the workflow.

In the case of an embodiment thereof, the first and the second half-shell each comprises a heating system for heating the first and the second half-shell from outside and/or from inside. This measure solves the problem of thermal stabilization, which arises when a closed system is combined with an open system. It has already been mentioned hereinbefore that, if the inner chamber walls are not at a higher temperature above the boiling point of the condensation medium, such as Galden, not enough gas will be generated to control a condensation soldering process. If the closed system is integrated into the open system, the closed system must inevitably be opened in order to allow assemblies to be transferred from one system to the other. This makes the thermal stabilization of the closed system more difficult. The heating systems in/at the half shells will solve this problem.

According to a further embodiment, valves for opening and closing fluid lines are attached to or provided close to the hermetically sealed process chamber, so as to supply or suck off vaporous and/or condensed medium, such as Galden. This measure solves the problem of cross-contamination that arises when the closed system of the condensation process is integrated into the open system of the convection process. When the chamber of the closed system is opened, fluid (in particular Galden gas) can escape from the chamber and condense in the open convection system. Furthermore, the fluid may also condense in the fluid lines and contaminate the circulation system. In order to prevent this, all fluid lines are closed by suitable valves close to the chamber. This also prevents the medium, such as Galden, that has already been injected from flowing off again immediately before the volume fraction of gas required for the condensation process has been generated therefrom. In addition, all fluid is sucked out of the chamber after the condensation process, so as to prevent the medium, such as Galden, from escaping into the convection system after the closed chamber has been opened.

According to a further embodiment, the reflow soldering system further comprises a unit for controlling the pressure in a condensation process. With pressure control, the condensation process and thus the setting of the peak temperature for executing the soldering process can be controlled more easily. This measure is supported by a pressure sensor arranged in the hermetically sealed process chamber. For example, during a phase of condensation soldering, the boiling temperature of the medium can be influenced by the pressure in the chamber. This means that the condensation medium (type of Galden) will not have to be changed, if some other solder material having a different melting point is used.

According to a further embodiment, the reflow soldering system further comprises a facility for executing a vacuum process. A vacuum process improves the quality of the solder joint.

According to a further embodiment, the facility for executing a vacuum process is functionally connectable to the hermetically sealed process chamber. The hermetically sealed process chamber offers a simple way of carrying out a vacuum process. In the hermetically sealed chamber required for this purpose, the condensation process for heat transfer as well as one (or a plurality of) vacuum process(es) can be realized. A combination of the vacuum process with the condensation process offers several advantages. For example, the condensation process may be started with a vacuum process after the items to be soldered have been placed in the chamber and the chamber has been closed completely. The medium, such as Galden, is now injected into the vacuum. The medium, such as Galden, gas spreads throughout the whole chamber, thus achieving the following effects:

a) The condensing gas heats the chamber walls from inside and thus helps to thermally stabilize the chamber. The amount of medium, such as Galden, required can thus be reduced significantly.

b) The gas condenses according to its partial pressure initially at low temperatures, thus allowing soldering processes to be executed at maximum temperatures lower than the medium, such as Galden, boiling point at 1000 mbar. It will, for example, be possible to carry out a lead-containing process (SnPb37, 183° C. melting point) with the same Galden HS 240 as the usual lead-free process (SnAg3.0Cu0.5, 217° C.).

c) The vacuum process before injection also helps to dry the items to be soldered (in particular the soldering paste) prior to soldering, so as to minimize e.g. voids (pores) and solder splashes.

According to a further embodiment, a medium to be condensed may be supplied to the hermetically sealed process chamber in liquid form or in vapor form for executing the condensation process.

According to still another embodiment, at least one of the convection process zones comprises a plurality of convection modules with independent temperature control, so as to define at least 2, preferably 3, more preferably 4, 5, 6, 7, 8 or 9 heating zones and/or cooling zones. In this way, very complex reflow profiles can be implemented in a very flexible manner.

BRIEF DESCRIPTION OF THE FIGURE

The present invention is now described making reference to the following FIGURE, the FIGURE shows a schematic overview of a reflow soldering system according to the present invention.

DETAILED DESCRIPTION OF THE INVENTION

The concept of the present invention is based on the problem mentioned at the beginning, viz. that higher quality requirements in the production of printed circuit boards as well as new applications of power electronics in vehicles require a more flexible implementation of reflow profiles. Although an expansion of the manufacturer's machine park for the implementation of different soldering principles would be a possible solution, this can normally not be realized because of lack of space and money for the necessary investments. This problem is the basis for the concept of integrating a plurality of soldering principles in one system. Condensation soldering avoids many of the disadvantages of convection soldering and vice versa. However, a combination of these two soldering principles in one system has never been realized, since convection soldering is an open system with corresponding advantages, while condensation soldering requires a closed system having respective other advantages. However, if an open system is combined with a closed system, some of the advantages of the respective open or closed system will get lost. For example, if the closed system is integrated into the open system, the workflow of the open system will be interrupted and throughput will decrease. On the other hand, the advantages of the closed system as regards contamination will get lost in the case of integration into an open system. The closed system must be opened in the open system and this may result in cross-contamination.

The concept of the present invention, viz. a convection system that can be combined with a condensation system in one system, is therefore based on the analysis of a complex and multi-facetted problem leading to a solution where a convection system is combined with a condensation system in such a way that convection soldering alone, condensation soldering alone or a combination thereof will be used "selectively". This means that a single system will be able to carry out, depending on the respective workpiece, an optimum process and to benefit from the advantages of the individual soldering principles in the best possible way. This concept is supplemented by embodiments, in which technical details of a possible implementation of the possibility of selecting soldering principles and their combination are defined.

The FIGURE shows an overview of the present invention, in which all the embodiments described are illustrated. It should be noted that the FIGURE also contains optional features, which are not regarded as essential features necessary for the present invention, but which further develop the invention in an advantageous manner.

In the FIGURE reference numeral 10 designates a reflow soldering system. Reference numerals 11, 12 and 13 designate soldering process zones. In particular, reference numeral 11 designates an upstream convection process zone, reference numeral 12 a condensation process zone and reference numeral 13 a downstream convection zone. Reference numeral 20 designates a workpiece to be soldered. Reference numeral 30 designates a segmented conveyor comprising the conveying segments 31, 32 and 33. Conveyor segment 31 is assigned to the upstream convection zone 11, conveyor segment 32 is assigned to the condensation process zone and segment 33 is assigned to the downstream convection process zone. Reference numerals 40 and 60 designate a lower half-shell 40 and an upper half-shell 60, which form a hermetically sealed process chamber 70 when closed. Reference numerals 45 and 65 designate a heating system 45 for the lower half-shell 40 and a heating system 65 for the upper half-shell 60. As can be seen in the FIGURE, the conveying segments 31, 32, 33 are divided in such a way that the conveying segment 32, which is assigned to the condensation process zone 12, can be fully accommodated by the hermetically sealed process chamber 70.

Although the heating systems 45 and 65 are shown as being located inside the walls of the half-shells, it is important to know that the heating systems may be arranged on the inner walls or, provided that the thermal conductivity is sufficiently high, also on the outer walls of the half-shells.

Still making reference to the FIGURE, reference numeral 50 (double arrow) designates the directions in which the upper half-shell can be moved, so as to open and close the hermetically sealed process chamber 70. Although only the upper half-shell 60 is shown to be movable in the FIGURE, it is important to know that also the lower half-shell 40 may be configured such that it is movable.

The FIGURE additionally shows that the convection process zones 11 and 13 are equipped with a plurality of convection modules, where reference numerals 80A to 80D designate convection modules above a workpiece 20 in the upstream convection process zone 11, reference numerals 81A to 81D designate convection modules below a workpiece 20 in the upstream convection process zone 11, reference numerals 82A to 82D designate convection modules above a workpiece 20 in the downstream convection process zone 13 and reference numerals 83A to 83D designate convection modules below a workpiece 20 in the downstream convection process zone 13. Although only four modules per module group are shown here, it is important to know that also more than four convection modules per group may be used for sufficient solder profiling. For example, 3, 4, 5, 6, 7, 8, 9, 10, 11 and more modules per process zone may be standard.

The convection modules 80A to 80D, 81A to 81D, 82A to 82D and 83A to 83D may be configured in the form of orifice nozzle fields having a special orifice nozzle geometry, through which heated or cooled protective gas, e.g. nitrogen, can flow, thus allowing a homogeneous and continuous heat transfer to a circuit board/workpiece. The orifice nozzles of the convection modules ensure a uniform flow to the workpieces, and the temperature for each zone may be controllable e.g. via a fan frequency. The conveying and flow speeds can be controlled separately for the convection modules. With this type of arrangement, precise heat profiles are possible, for example with a preheating zone, which is also suitable for executing a pyrolysis, a peak zone for melting the solder and a cooling zone.

The FIGURE also shows a control unit 100 with which the segments 31, 32, 33 of the conveyor 30 can be controlled individually. The control unit 100 is also able to control the reflow soldering system 10 in such a way that certain operating modes are selectively possible.

For example, the control unit 100 may operate the reflow soldering system 10 in a mode as a mere convection soldering system with the condensation process zone 12 switched off. In this case, the control unit 100 controls the condensation process zone 12 such that the upper half-shell 60 is lifted from the lower half-shell 40, so as to open the hermetically sealable process chamber 70. The segment 32 of the conveyor 30 assigned to the condensation process zone 12 is then controlled in such a way that workpieces 20 are conveyed as quickly as possible from the upstream convection process zone 11 controlled to act as a heating zone to the downstream convection process zone 13 controlled to act as a cooling zone.

According to another mode, the control unit 100 may operate the reflow soldering unit 10 as a mere condensation soldering system with the convection process zones 11 and 13 switched off. In this case the control unit 100 switches off the convection modules 80A to 80D, 81A to 81D, 82A to 82D and 83A to 83D in the convection process zones 11 and 13. The segments 31 and 33 of the conveyor 30 which are assigned to the convection process zones 11 and 13 are then controlled in such a way that workpieces 20 are transported into the condensation process zone 12 or out of it, when the hermetically sealable process chamber 70 is open. Furthermore, the control unit 100 controls the reflow soldering system 10 in such a way that a condensation soldering process is carried out, when a workpiece 20 is present in the hermetically sealed process chamber 70, i.e. when the hermetically sealable process chamber 70 is in a closed state.

According to a further mode, referred to as mixed mode hereinafter, the reflow soldering system 10 is operated as a combined soldering system with an arbitrary combination of components of the convection process zones 11, 13 and the condensation process zone 12, so as to implement complex soldering profiles. For example, the convection modules 80A to 80D and 81A to 81D of the upstream convection process zone 11 may be set such that they implement a preheating profile, optionally with a pyrolysis function at the convection modules 80D and 81D. The actual soldering process then takes place in the condensation process zone 12. The convection modules 82A to 82D and 83A to 83D of the downstream convection process zone 13 can then be set to provide controlled cooling. The segments 31, 32, and 33 of the conveyor 30 can then be controlled in such a way that an optimum compromise between maximizing the throughput and precision of the solder joints is accomplished.

The FIGURE additionally shows valves 210, 220, which are directly attached to the respective half-shells 40 and 60 of the condensation process zone 12, through which the fluid lines 110, 120 can be connected to the hermetically sealed process chamber 70. By means of the valves, the medium or Galden condensation agent can be prevented from escaping uncontrolled from the process chamber 70. For example, a controller 300, which may also be integrated in the control unit 100, may open the inlet valve 210 and instruct a fluid handling system 500 to inject vaporous medium or Galden via the fluid line 110 through the inlet valve 210 into the hermetically sealed process chamber 70. After the condensation process, the controller 300 may open the suction valve 220 and instruct the fluid handling system 500 to suck off vaporous and condensed medium or Galden from the hermetically sealed process chamber 70. In the fluid handling system 500, the used medium or Galden may also be cleaned in order to reuse it for a subsequent condensation process.

The FIGURE also shows a pressure sensor 700 with a measuring range of e.g. 0-1500 mbar, which is able to measure the internal pressure of the hermetically sealed process chamber 70. The controller 300 can use the measured pressure to control a pump in the fluid handling system 500, so that a specific pressure will be prevail inside the hermetically sealed process chamber 70. This pressure may be used for controlling the peak temperature, by way of example.

The fluid handling system 500 may, for example, also be used for accommodating the medium or Galden supply infrastructure. In this case, the fluid handling system 500 may, as a separate module, be docked on to an existing convection soldering system with vacuum option. This module contains both the medium or Galden supply unit and the medium or Galden cleaning unit. This module could then be separated from the system at any time and with very little effort.

The FIGURE also shows a facility 600 for executing a vacuum process, which can be functionally used together with the hermetically sealed chamber 70. Making use of the pressure information provided by the pressure sensor 700, the controller 300 is able to control the facility 600 for executing a vacuum process such that a vacuum process can be executed under a predetermined vacuum, so as to dry the items to be soldered prior to soldering and minimize voids and solder splashes.

An exemplary process for mixed operation of the reflow soldering system according to the present invention comprises the following steps:
1. adjusting a desired temperature profile in the upstream convection process zone 11 for the purpose of preheating;
2. adjusting a desired temperature profile in the downstream convection process zone 13 for the purpose of cooling;
3. opening the hermetically sealable process chamber 70;
4. causing a workpiece 20 to pass through the upstream convection process zone 11 for the purpose of preheating;
5. inserting the preheated workpiece 20 into the hermetically sealable process chamber 70;
6. closing and sealing the hermetically sealable process chamber 70;
7. executing the condensation soldering process;
8. opening the hermetically sealable process chamber 70;
9. advancing the soldered workpiece 20 to the downstream convection process zone 13 for controlled cooling of the workpiece 20.

An exemplary condensation process may include the following steps:
1. starting the condensation process with a vacuum process after the items to be soldered have been located in the chamber and the chamber has been closed completely.
2. Injecting medium or Galden into the vacuum.
3. Allowing the medium or Galden gas to spread throughout the whole chamber and allowing a predetermined pressure to be maintained.
4. Condensing the medium or Galden gas on the workpiece, thus causing the solder to melt.

The above detailed description of the present invention with reference to the FIGURE should not be interpreted such that all the features of the FIGURE collectively represent an essential part of the present invention. The FIGURE only serves the purpose of illustration and combines a large number of possible embodiments. The essential features are specified in the claims. Special embodiments are defined in the dependent claims.

What is claimed is:
1. A reflow soldering system comprising:
one or a plurality of individually heatable soldering process zones, wherein the reflow soldering system is configured to supply heat to a workpiece selectively through condensation or through convection or as a combination of convection and condensation, wherein the reflow soldering system includes at least two soldering process zones comprising at least one condensation process zone and at least one convection process zone located upstream or downstream of the latter;
a conveyor comprising a plurality of segments for conveying the workpiece through the soldering process zones and from one soldering process zone to the next, wherein the condensation process zone is configured to operate selectively as a hermetically sealed process chamber or to allow the conveyor to pass workpieces unhindered;
which further comprises a control unit that is able to control the segments of the conveyor individually and to control the reflow soldering system such that it selectively allows the following modes of operation:
mode 1: mere convection soldering system with the condensation process zone switched off,
mode 2: mere condensation soldering system with the convection process zone switched off, and
mode 3: combined soldering system with an arbitrary combination of components of the convection process zone and the condensation process zone, so as to implement soldering profiles.

2. The reflow soldering system according to claim 1, wherein the hermetically sealed process chamber is configured as a first half-shell and a second half-shell, at least one of the half-shells being movable perpendicularly to a conveying direction of the conveyor, so that the hermetically sealed process chamber will be able to assume an open state, in which a conveyed workpiece can be moved into and out of the condensation process zone.

3. The reflow soldering system according to claim 2, wherein the first and the second half-shell each comprises a heating system for heating the first and the second half-shell from outside and/or from inside.

4. The reflow soldering system according to claim 1, wherein valves for opening and closing fluid lines are attached to or provided close to the hermetically sealed process chamber, so as to supply or suck off vaporous and/or condensed medium.

5. The reflow soldering system according to claim 1, which further comprises a unit for controlling the pressure in a condensation process.

6. The reflow soldering system according to claim 5, wherein the hermetically sealed process chamber includes a pressure sensor.

7. The reflow soldering system according to claim 5, which is configured for influencing, during a phase of condensation soldering, the boiling temperature of the medium through the pressure in the chamber.

8. The reflow soldering system according to claim 1, which further comprises a facility for executing a vacuum process.

9. The reflow soldering system according to claim 1 and further comprising:
a facility for executing a vacuum process, and
wherein the facility for executing a vacuum process is functionally connectable to the hermetically sealed process chamber.

10. The reflow soldering system according to claim 1, wherein a medium to be condensed may be supplied to the hermetically sealed process chamber in liquid form but also in vapor form.

11. The reflow soldering system according to claim 1, wherein at least one of the convection process zones comprises a plurality of convection modules with independent temperature control, so as to define at least two heating zones and/or cooling zones.

12. A reflow soldering system for soldering electronic components comprising:
an upstream convection soldering process zone;
a downstream convection soldering process zone;
a condensation soldering process zone placed between said upstream convection soldering process zone and said downstream convection soldering process zone;
a segmented conveyor extending through said upstream convection soldering process zone, said downstream convection soldering process zone, and said condensation soldering process zone;
a seal configured to selectively hermetically seal said condensation soldering process zone, wherein said condensation soldering process zone is capable of being operated as a closed system sealed from said upstream convection soldering process zone and said downstream convection soldering process zone or as an open system open to said upstream convection soldering process zone and said downstream convection soldering process zone; and
a control unit coupled to said upstream convection soldering process zone, said downstream convection soldering process zone, and said condensation soldering process zone configured to control said segmented conveyor and the reflow soldering system to selectively control operating modes of the reflow soldering system with the operating modes comprising,
a mere convection soldering system with the condensation process zone switched off,
a mere condensation soldering system with the convection process zone switched off, and
a combined soldering system with an arbitrary combination of components of the convection process zone and the condensation process zone,
whereby pre-configured soldering profiles are capable of being implemented.

* * * * *